(12) United States Patent
Chang et al.

(10) Patent No.: US 11,961,911 B2
(45) Date of Patent: Apr. 16, 2024

(54) SEMICONDUCTOR DEVICES INCLUDING CHANNEL REGIONS HAVING NON-UNIFORM GE CONCENTRATION

(71) Applicant: TAIWAN SEMICONDUCTOR MANUFACTURING COMPANY, LTD., Hsinchu (TW)

(72) Inventors: Hsiao-Chun Chang, Hukou Township (TW); Guan-Jie Shen, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 17/712,998

(22) Filed: Apr. 4, 2022

(65) Prior Publication Data
US 2022/0231158 A1    Jul. 21, 2022

Related U.S. Application Data

(62) Division of application No. 16/654,470, filed on Oct. 16, 2019, now Pat. No. 11,296,227.

(51) Int. Cl.
*H01L 29/78* (2006.01)
*H01L 21/02* (2006.01)
(Continued)

(52) U.S. Cl.
CPC ...... *H01L 29/785* (2013.01); *H01L 21/02532* (2013.01); *H01L 21/02675* (2013.01); *H01L 21/324* (2013.01); *H01L 29/0847* (2013.01); *H01L 29/1037* (2013.01); *H01L 29/105* (2013.01); *H01L 29/66545* (2013.01); *H01L 29/66636* (2013.01); *H01L 29/66795* (2013.01)

(58) Field of Classification Search
None
See application file for complete search history.

(56) References Cited

U.S. PATENT DOCUMENTS

| 8,497,177 B1 | 7/2013 | Chang et al. |
| 9,093,530 B2 | 7/2015 | Huang et al. |

(Continued)

FOREIGN PATENT DOCUMENTS

| KR | 20160122277 A | 10/2016 |
| TW | 201442117 A | 11/2014 |
| TW | 201924042 A | 6/2019 |

OTHER PUBLICATIONS

Non-Final Office Action issued in U.S. Appl. No. 16/654,470 dated Apr. 1, 2021.
(Continued)

*Primary Examiner* — Nilufa Rahim
(74) *Attorney, Agent, or Firm* — STUDEBAKER & BRACKETT PC

(57) ABSTRACT

In a method of manufacturing a semiconductor device including a Fin FET, a fin structure, which has an upper fin structure made of SiGe and a bottom fin structure made of a different material than the upper fin structure, is formed, a cover layer is formed over the fin structure, a thermal operation is performed on the fin structure covered by the cover layer, and a source/drain epitaxial layer is formed in a source/drain region of the upper fin structure. The thermal operation changes a germanium distribution in the upper fin structure.

21 Claims, 15 Drawing Sheets

(51) Int. Cl.
*H01L 21/324* (2006.01)
*H01L 29/08* (2006.01)
*H01L 29/10* (2006.01)
*H01L 29/66* (2006.01)

(56) References Cited

U.S. PATENT DOCUMENTS

| | | | |
|---|---|---|---|
| 9,171,929 B2 | 10/2015 | Lee et al. | |
| 9,214,555 B2 | 12/2015 | Oxland et al. | |
| 9,236,267 B2 | 1/2016 | De et al. | |
| 9,378,952 B1 | 6/2016 | Basker et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 2008/0128863 A1* | 6/2008 | Kondo | H01L 21/0262 257/E25.001 |
| 2014/0175543 A1 | 6/2014 | Glass et al. | |
| 2015/0069465 A1 | 3/2015 | Cheng et al. | |
| 2015/0270344 A1* | 9/2015 | Cheng | H01L 29/165 438/479 |
| 2015/0311286 A1* | 10/2015 | Lee | H01L 29/66795 438/157 |
| 2015/0357190 A1* | 12/2015 | Chien | H01L 21/31111 438/492 |
| 2015/0364555 A1 | 12/2015 | Cheng et al. | |
| 2016/0005834 A1* | 1/2016 | Pawlak | H01L 21/02532 438/492 |
| 2016/0064526 A1 | 3/2016 | Jacob et al. | |
| 2017/0194463 A1 | 7/2017 | Cheng et al. | |
| 2018/0151717 A1* | 5/2018 | Cheng | H01L 29/1054 |
| 2018/0286862 A1* | 10/2018 | Chao | H01L 29/165 |
| 2018/0308764 A1 | 10/2018 | Bi et al. | |
| 2018/0337098 A1* | 11/2018 | Ando | H01L 21/823821 |
| 2018/0366465 A1* | 12/2018 | Ching | H01L 29/161 |
| 2019/0164774 A1 | 5/2019 | Lee et al. | |
| 2019/0311958 A1* | 10/2019 | Lee | H01L 29/165 |

OTHER PUBLICATIONS

Final Office Action issued in U.S. Appl. No. 16/654,470 dated Aug. 3, 2021.

Notice of Allowance issued in U.S. Appl. No. 16/654,470 dated Nov. 29, 2021.

* cited by examiner $$I_D = \boxed{\mu} C_{ox} \frac{W}{L} \left( (V_{GS} - \boxed{V_{th}}) V_{DS} - \frac{V_{DS}^2}{2} \right)$$

Bulk Ge: $\boxed{\mu_h \leq 1900}$, $V_T = V_{fb} + \boxed{2\phi_F} + \frac{\sqrt{4\varepsilon_s q N_a \phi_F}}{C_{ox}}$ $$\phi_F = \boxed{(1/2 Eg)} - (E_F - E_V)$$

① Fin surface: Eg ↓ ⇒ Vt ↓ ⇒ On current ↑
② Fin center: ΔEv ↓ ⇒ BTBT(band to banf tunneling) leakage ↓

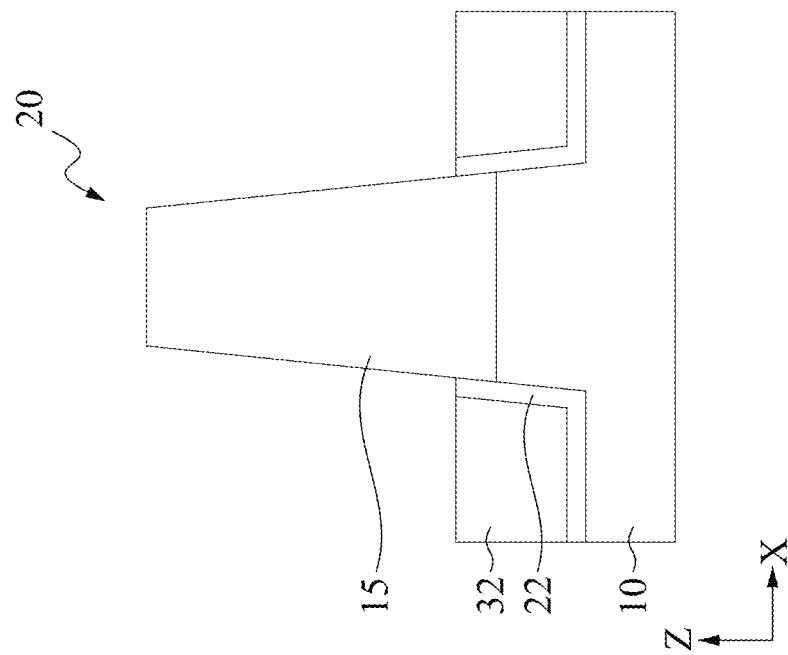
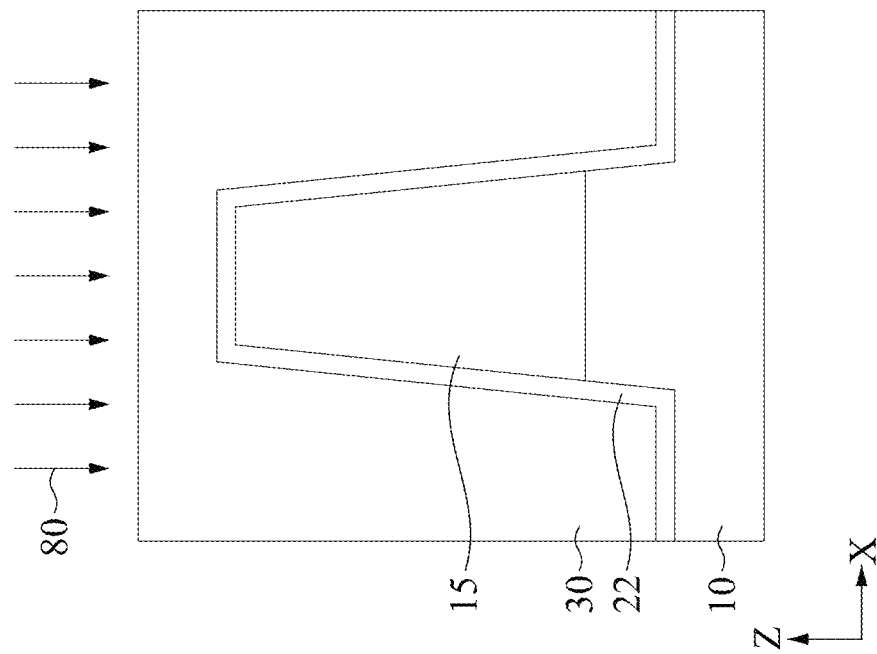

SEMICONDUCTOR DEVICES INCLUDING CHANNEL REGIONS HAVING NON-UNIFORM GE CONCENTRATION

RELATED APPLICATIONS

This application is a division of U.S. patent application Ser. No. 16/654,470 filed Oct. 16, 2019, now U.S. Pat. No. 11,296,227, the entire content of which is incorporate herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies, and sources and drains are formed by using an epitaxial growth method.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 23 shows a cross sectional view of one of the various stages of a sequential semiconductor device manufacturing operation according to embodiments of the present disclosure.

FIG. 24 shows a cross sectional view of one of the various stages of a sequential semiconductor device manufacturing operation according to embodiments of the present disclosure.

DETAILED DESCRIPTION

Figure 2:
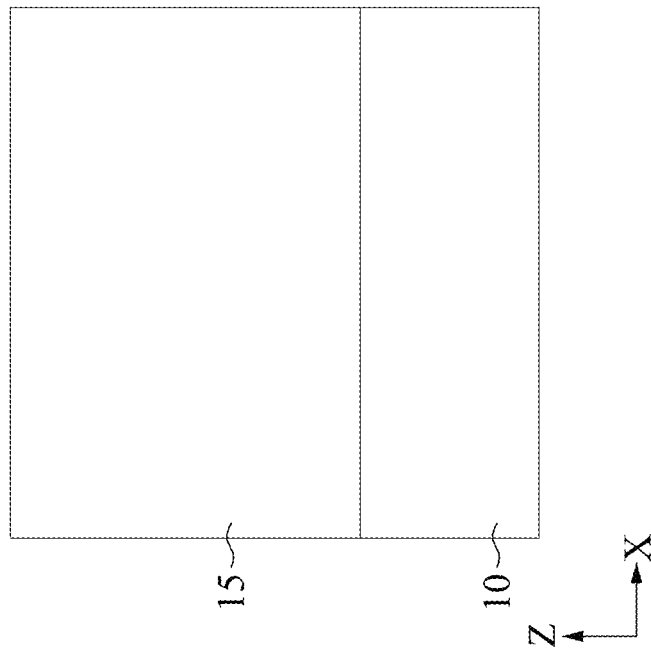
FIG. 2 shows a cross sectional view of one of the various stages of a sequential semiconductor device manufacturing operation according to embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of" Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described. Materials, configurations, dimensions, processes and/or operations same as or similar to those described with one embodiment may be employed in the other embodiments and the detailed explanation may be omitted.

Disclosed embodiments relate to a semiconductor device and its manufacturing method, in particular, a channel region of a fin field effect transistor (Fin FET). The embodiments such as those disclosed herein are generally applicable not only to a Fin FET but also other FETs.

Silicon germanium (SiGe) is one of the semiconductor materials suitable for a channel region of a p-type FET due to its higher carrier mobility than Si. While a high Ge concentration in the channel region increases the carrier (hole) mobility, a high Ge concentration channel would suffer worse current leakage, e.g., sub-threshold current leakage, due to less gate control at the center of the fin structure.

In the present disclosure, a SiGe channel region has non-uniform Ge concentration. In particular, a SiGe fin channel of a FinFET has a higher Ge concentration near the surface of the fin structure than the center of the fin structure. With such a SiGe fin structure, it is possible to enhance on-state current by higher carrier mobility and lower threshold voltage Vt due to the higher Ge concentration at the surface region of the fin structure, while suppressing current leakage at the sub threshold region due to the lower Ge concentration at the center region of the fin structure.

FIGS. 1-11B show exemplary cross sectional views of various stages for manufacturing a Fin FET device according to one embodiment of the present disclosure. It is understood that additional operations can be provided before, during, and after the processes shown by FIGS. 1-11B, and some of the operations described below can be replaced or eliminated, for additional embodiments of the method. The order of the operations/processes may be interchangeable. The semiconductor layers and substrate are crystalline, unless otherwise explained.

Figure 1:
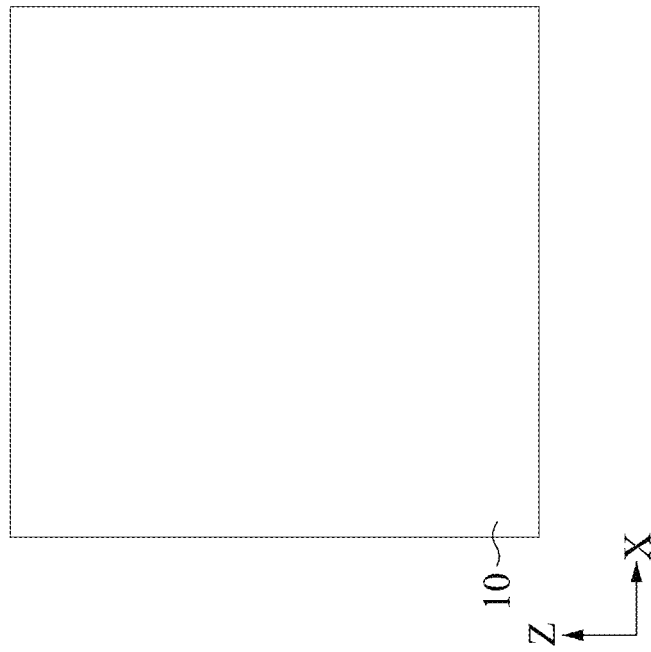
FIG. 1 shows a cross sectional view of one of the various stages of a sequential semiconductor device manufacturing operation according to embodiments of the present disclosure.

As shown in FIG. 1, a substrate 10 is provided. The substrate 10 is, for example, a p-type silicon substrate with an impurity concentration in a range from about $1 \times 10^{15}$ $cm^{-3}$ to about $1 \times 10^{16}$ $cm^{-3}$. In other embodiments, the substrate is an n-type silicon substrate with an impurity concentration in a range from about $1 \times 10^{15}$ $cm^{-3}$ to about $1 \times 10^{16}$ $cm^{-3}$. The substrate 10 may include various regions that have been suitably doped with impurities (e.g., p-type or n-type conductivity).

A $Si_{1-x}Ge_x$ layer 15 is epitaxially formed on the substrate 10 as shown in FIG. 2. In some embodiments, a part of or an entire surface of the substrate is etched (patterned) and then a $Si_{1-x}Ge_x$ layer 15 is epitaxially formed on the etched surface of the substrate 10. In some embodiments, the germanium concentration x is in a range from about 0.1 to about 0.3 in some embodiments, and is in a range from about 0.15 to about 0.25 in other embodiments. When the Ge concentration exceeds 0.3, interface defects (Dit defects) and/or wiggle defects likely increase, and when the Ge concentration is below 0.1, a high mobility of germanium cannot be obtained (low mobility).

The SiGe layer 15 can be formed by chemical vapor deposition (CVD), atomic layer deposition (ALD), molecular beam epitaxy (MBE) or any other suitable epitaxial growth processes. In some embodiments, the SiGe layer 15 is grown at a temperature of about 600 to 800° C. under a pressure of about 80 to 150 Torr, by using a Si containing gas such as $SiH_4$, $Si_2H_6$ or $SiCl_2H_2$, and a Ge containing gas, such as $GeH_4$, $Ge_2H_6$ or $GeCl_2H_2$. In some embodiments, in-situ doping is performed. In some embodiments, the thickness of the SiGe layer 15 is in a range from about 20 nm to about 100 nm and is in a range from about 40 nm to 80 nm in other embodiments. In some embodiments, one or more SiGe layers having a lower Ge concentration are epitaxially formed as a buffer layer on the substrate 10 before the SiGe layer 15 is formed. In some embodiments, the SiGe layer 15 further includes Sn. The Ge concentration in the SiGe layer 15 is substantially uniform.

Figure 3:
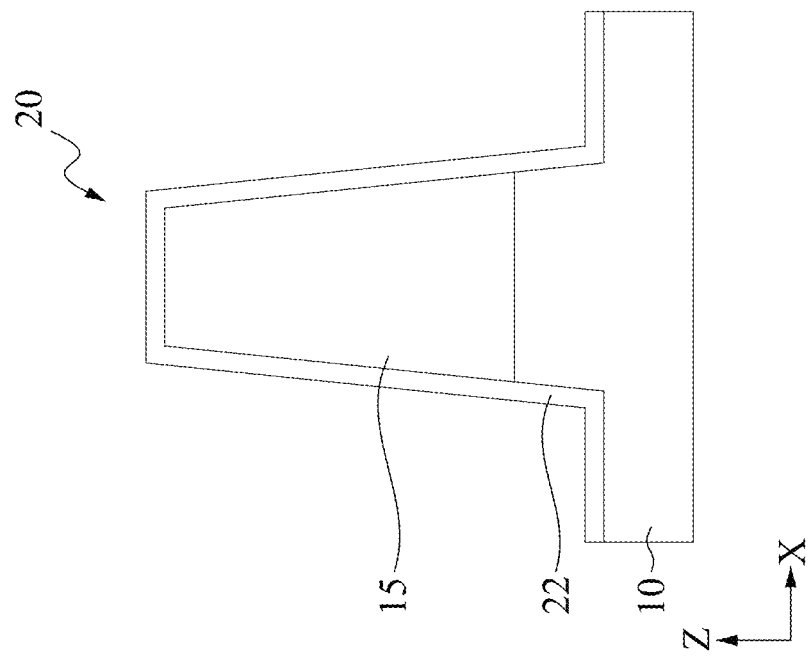
FIG. 3 shows a cross sectional view of one of the various stages of a sequential semiconductor device manufacturing operation according to embodiments of the present disclosure.

As shown in FIG. 3, one or more fin structures 20 is formed. The fin structure 20 can be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structures. The multi-patterning processes combining photolithography and self-aligned processes generally result in forming a pair of fin structures. In FIG. 3, one fin structure 20 is illustrated. However, the numbers of the fin structures is not limited to one for one FET. In some embodiments, two, three, four or more fin structures are formed for one FET. In some embodiments, one or more dummy fin structures are formed adjacent to active fin structure(s) 20.

In some embodiments, as shown in FIG. 3, a part of the substrate 10 is also etched to form a fin bottom structure. In other embodiments, the entire fin structure 20 is made of the SiGe layer 15. The height H1 of the upper fin structure (SiGe layer 15) is in a range from about 20 nm to about 100 nm in some embodiments, and is in a range from about 40 nm to about 80 nm in other embodiments. The height H2 of the bottom fin structure (part of the substrate 10) is in a range from about 0 nm to about 20 nm in some embodiments, and is in a range from about 5 nm to about 10 nm in other embodiments. The width W1 of the fin structure 20 at the interface between the SiGe layer 15 and the bottom fin structure is in a range from about 10 nm to about 50 nm in some embodiments, and is in a range from about 15 nm to about 30 nm in other embodiments.

Figure 4:
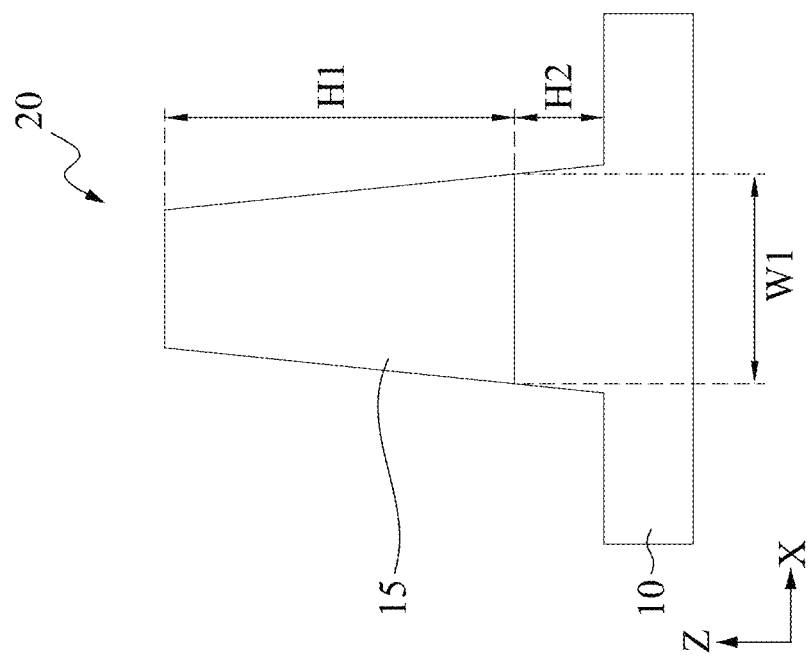
FIG. 4 shows a cross sectional view of one of the various stages of a sequential semiconductor device manufacturing operation according to embodiments of the present disclosure.

Then, as shown in FIG. 4, one or more liner layer 22 is formed to cover the fin structure 20. In some embodiments, the fin liner layer 22 includes one or more layers of silicon oxide, silicon nitride, SiON, SiCN and SiOCN or any other suitable material. In some embodiments, the thickness of the fin liner layer 22 is in a range from about 10 nm to about 20 nm. The fin liner layer 22 can be formed by using a CVD, such as plasma-enhanced chemical vapor deposition (PECVD), an atmospheric pressure chemical vapor deposition (APCVD), a low-pressure CVD (LPCVD), and a high density plasma CVD (HDPCVD), an atomic layer deposition (ALD), and any other suitable film formation processes. In some embodiments, the liner layer 22 is a single silicon nitride layer and in other embodiments, the liner layer 22 is a bi-layer of silicon oxide and silicon nitride.

Figure 5:
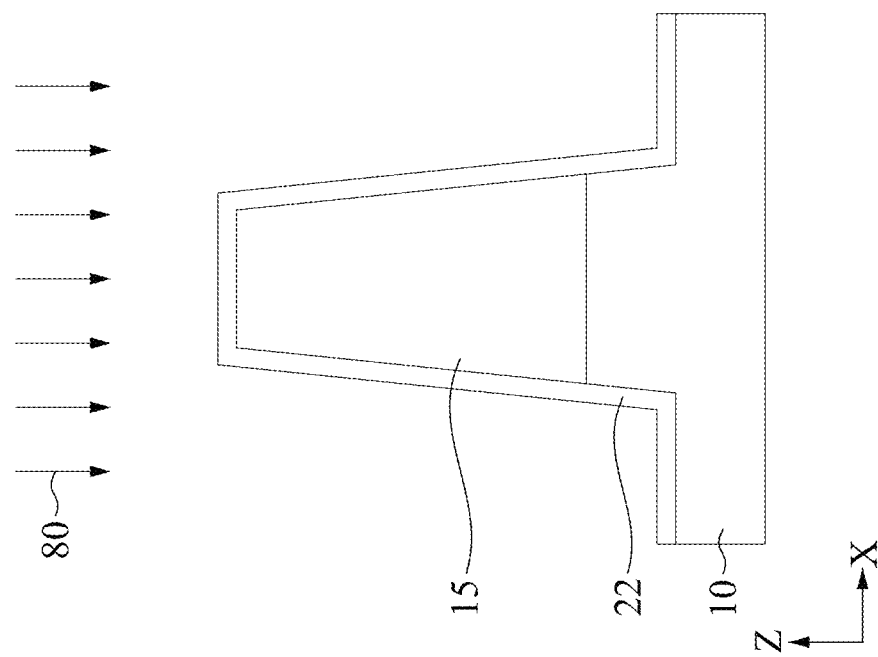
FIG. 5 shows a cross sectional view of one of the various stages of a sequential semiconductor device manufacturing operation according to embodiments of the present disclosure.

Subsequently, as shown in FIG. 5, a melting laser annealing operation 80 is performed to redistribute germanium in the SiGe fin structure 20 to have a non-uniform Ge distribution. When laser light is irradiated to the SiGe fin structure through the fin liner layer 22, the irradiated portion of the SiGe fin structure is heated above its melting point and becomes a melting state, and after the laser irradiation, the melted portion of the fin structure recrystallizes. In the recrystallization process, germanium tends to move to the surface of the fin structure, resulting in the surface region having a higher germanium concentration than the center of the fin structure.

In some embodiments, the energy of the laser is in a range from about 0.5 J/cm$^2$ to about 5 J/cm$^2$, and is in a range from about 1.0 J/cm$^2$ to about 2.0 J/cm$^2$ in other embodiments. In some embodiments, the laser irradiation time is in a range from 0.1 nsec to 10 nsec and in other embodiments, is in a range from about 0.5 nsec to about 5 nsec. In some embodiments, the SiGe fin structure 20 is heated to more than the melting point of SiGe. In some embodiments, the heated temperature is in a range from about 1200° C. to about 1400° C. In other embodiments, the temperature is in a range from about 800° C. to about 1200° C. The laser anneal condition setting depends on the germanium content in the fin structure. In some embodiments, an optimum or desired laser anneal energy is set to make the SiGe fin a near-melting state so that germanium can re-distribute as regrowth, and the germanium profile has a higher concentration at the fin surface and a lower concentration at the fin center. If the laser energy is too high beyond the aforementioned ranges, the SiGe fin structure would be in a completely melted state, which should be avoided. If the energy is too low, the SiGe fin would not re-grow, which means that the germanium concentration would not change. In some embodiments, the melting laser annealing operation 80 is performed in an inert gas ambient, such as an $N_2$, Ar or He ambient.

Figure 6:
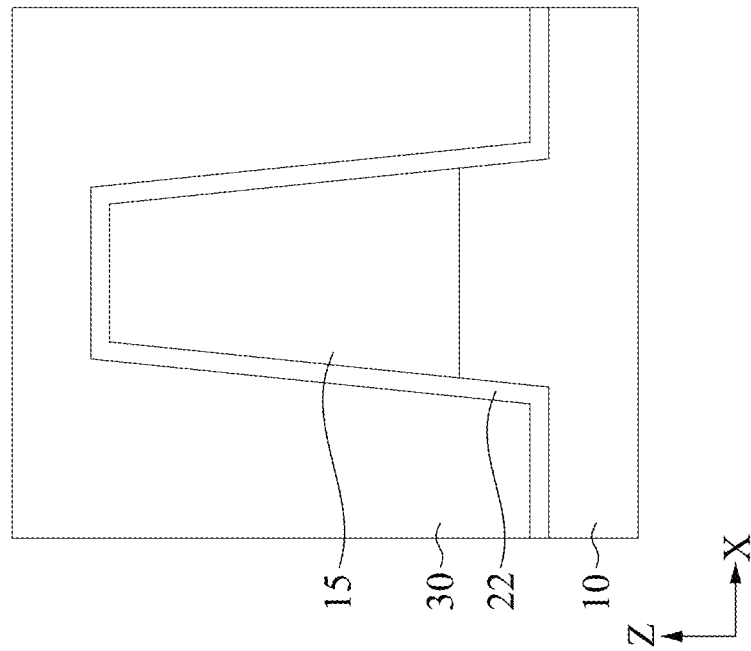
FIG. 6 shows a cross sectional view of one of the various stages of a sequential semiconductor device manufacturing operation according to embodiments of the present disclosure.

After the melting laser annealing operation 80, an insulating layer 30 is formed as shown in FIG. 6. The insulating layer 30 is formed in a thick layer so that the fin structure 20 is fully embedded in the thick layer, as shown in FIG. 6.

The insulating material for the insulating layer 30 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove the un-desired element(s) to form silicon oxide. When the un-desired element(s) is removed, the flowable film densifies and shrinks. The flowable film may be doped with boron and/or phosphorous.

Figure 7:
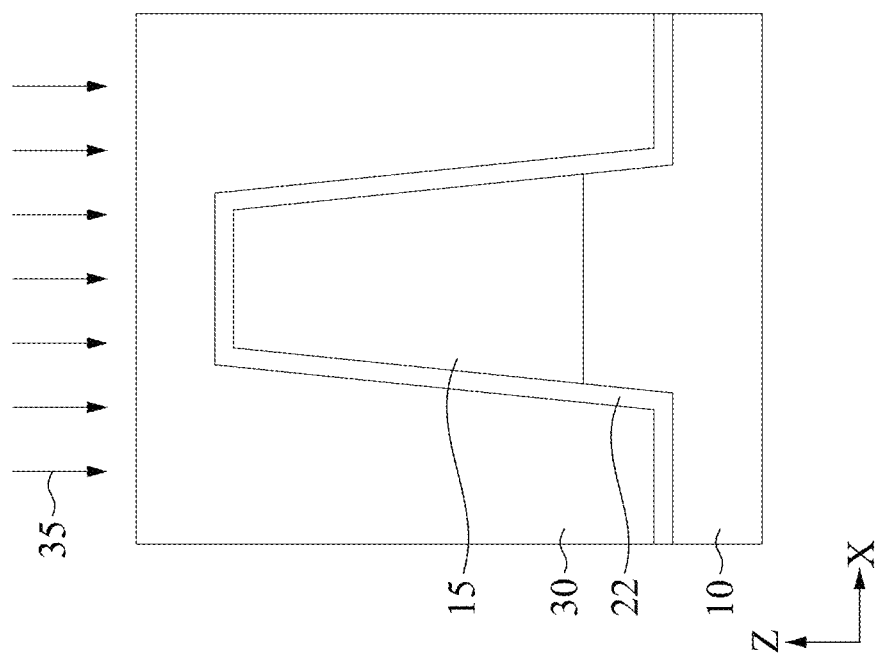
FIG. 7 shows a cross sectional view of one of the various stages of a sequential semiconductor device manufacturing operation according to embodiments of the present disclosure.

Further, as shown in FIG. 7, an annealing operation 35 is performed. The annealing operation 35 includes a rapid thermal annealing (RTA) using an infrared light in an inert gas ambient, such as an $N_2$, Ar or He ambient, in some embodiments. The temperature of the annealing operation 35 is lower than the temperature of the melting laser annealing operation 80 to prevent further germanium redistribution, and is in a range from about 600° C. to about 700° C. In some embodiments, the annealing time is in a range from about 1 sec to 60 sec. Other annealing operations, such as a plate baking, may be utilized.

Figure 8:
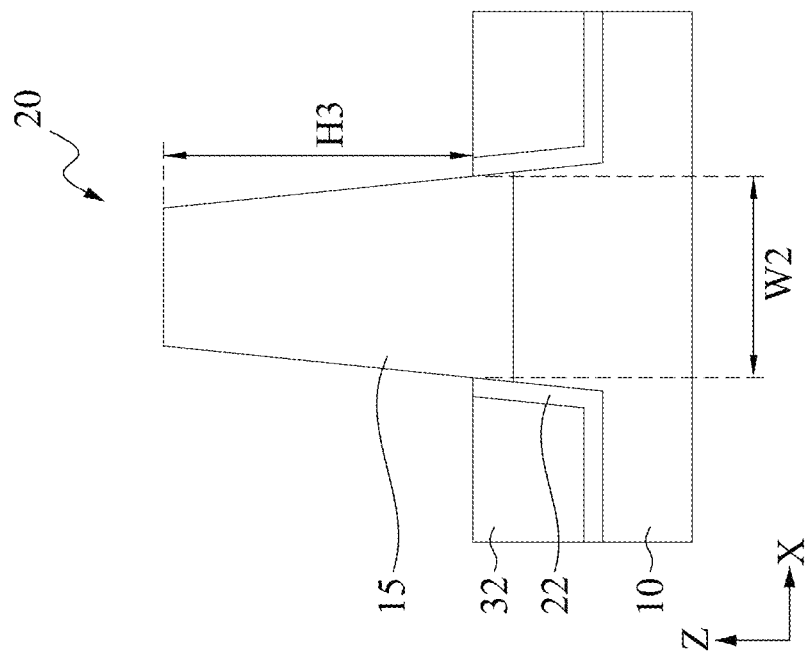
FIG. 8 shows a cross sectional view of one of the various stages of a sequential semiconductor device manufacturing operation according to embodiments of the present disclosure.

After the annealing operation 35, the insulating layer 30 is recessed so as to expose the upper portion of the fin structure 20, to form an isolation insulating layer 32, as shown in FIG. 8. The fin liner layer 22 is also etched down as shown in FIG. 8. The isolation insulating layer 32 may also be called a "shallow-trench-isolation (STI)" layer. In some embodiments, the insulating material layer 30 is recessed to the level equal to or above the interface between the substrate 10 and the SiGe layer 15. In other embodiments, the insulating material layer 30 is recessed to the level below the interface between the substrate 10 and the SiGe layer 15.

The height H3 of the fin structures from the upper surface of the isolation insulating layer 32 is in a range from about 20 nm to about 100 nm in some embodiments, and is in a range from about 40 nm to about 80 nm in other embodiments. The width W2 of the fin structure 20 at the level of the upper surface of the isolation insulating layer 32 is in a range from about 10 nm to about 50 nm in some embodiments, and is in a range from about 15 nm to about 30 nm in other embodiments.

Figure 9B:
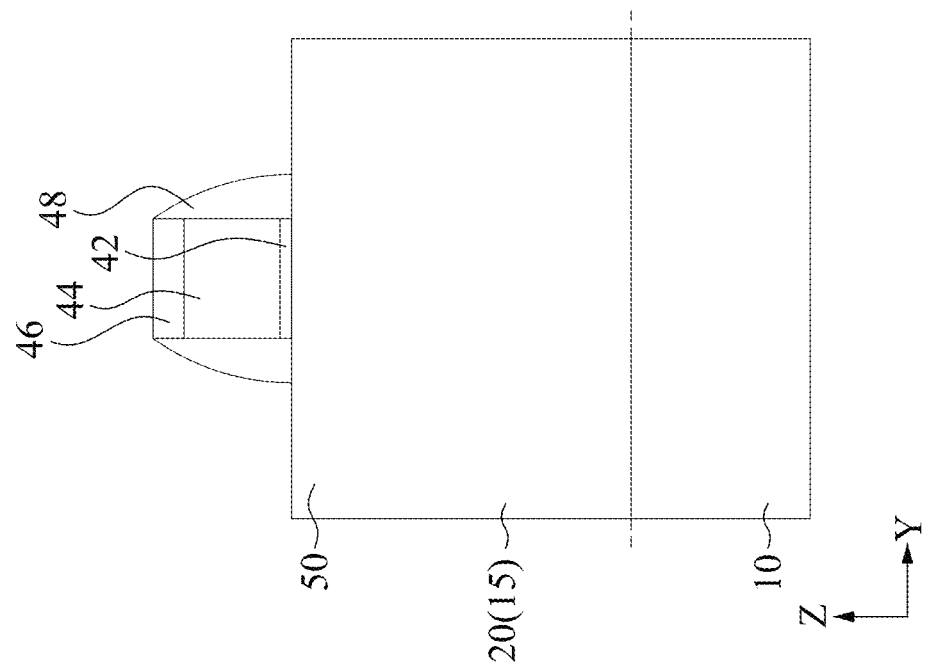
FIGS. 9A and 9B show cross sectional views of one of the various stages of a sequential semiconductor device manufacturing operation according to embodiments of the present disclosure.
Figure 9A:
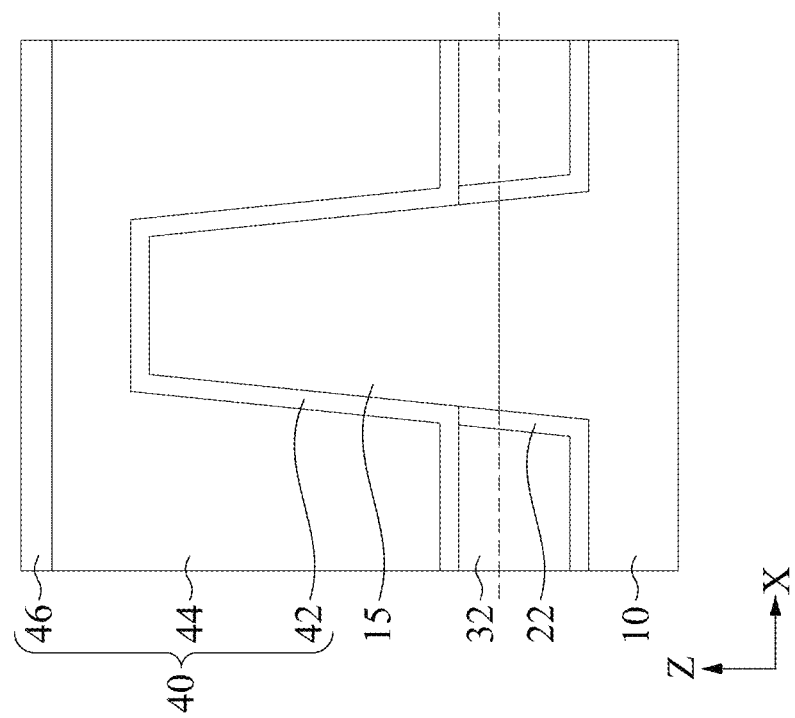

After the isolation insulating layer 32 is formed, a sacrificial gate structure 40 is formed over the fin structure 20, as shown in FIGS. 9A and 9B. FIG. 9A is a cross sectional view along the gate extending direction (X), and FIG. 9B is a cross sectional view along the source-to-drain direction (Y).

To fabricate the sacrificial gate structure 40, a dielectric layer and a poly silicon layer are formed over the isolation insulating layer 32 and the exposed fin structure 20, and then patterning operations are performed so as to obtain gate structures including a sacrificial gate electrode 44 made of poly silicon and a sacrificial gate dielectric layer 42. In some embodiments, the polysilicon layer is patterned by using a hard mask and the hard mask remains on the sacrificial gate electrode 44 as a cap insulating layer 46. The hard mask (cap insulating layer 46) includes one or more layers of insulating material. The cap insulating layer 46 includes a silicon nitride layer formed over a silicon oxide layer in some embodiments. In other embodiments, the cap insulating layer 46 includes a silicon oxide layer formed over a silicon nitride layer. The insulating material for the cap insulating layer 46 may be formed by CVD, PVD, ALD, e-beam evaporation, or other suitable process. In some embodiments, the sacrificial gate dielectric layer 42 includes one or more layers of silicon oxide, silicon nitride, silicon oxynitride, or high-k dielectrics. In some embodiments, a thickness of the sacrificial gate dielectric layer 42 is in a range from about 2 nm to about 20 nm, and in a range from about 2 nm to about 10 nm in other embodiments.

Further, gate sidewall spacers 48 are formed on both sidewalls of the sacrificial gate structure 40, as shown in FIG. 9B. The sidewall spacers 48 include one or more layers of insulating material, such as $SiO_2$, SiN, SiON, SiOCN or SiCN, which are formed by CVD, PVD, ALD, e-beam evaporation, or other suitable process. A low-k dielectric material may be used as the sidewall spacers. The sidewall spacers 48 are formed by forming a blanket layer of insulating material and performing anisotropic etching. In one embodiment, the sidewall spacer layers are made of silicon nitride based material, such as SiN, SiON, SiOCN or SiCN.

Figure 10B:
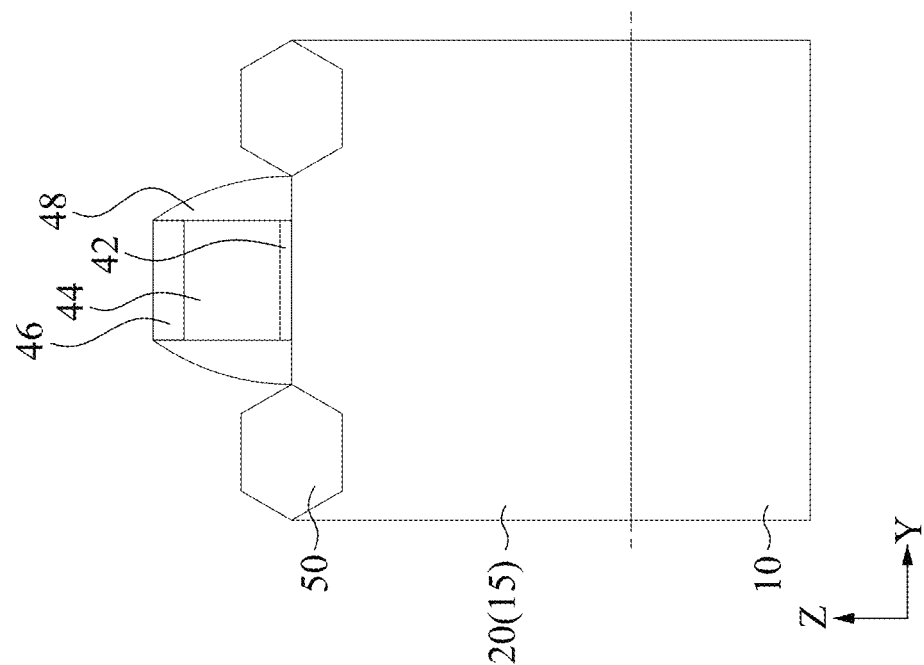
FIGS. 10A and 10B show cross sectional views of one of the various stages of a sequential semiconductor device manufacturing operation according to embodiments of the present disclosure.
Figure 10A:
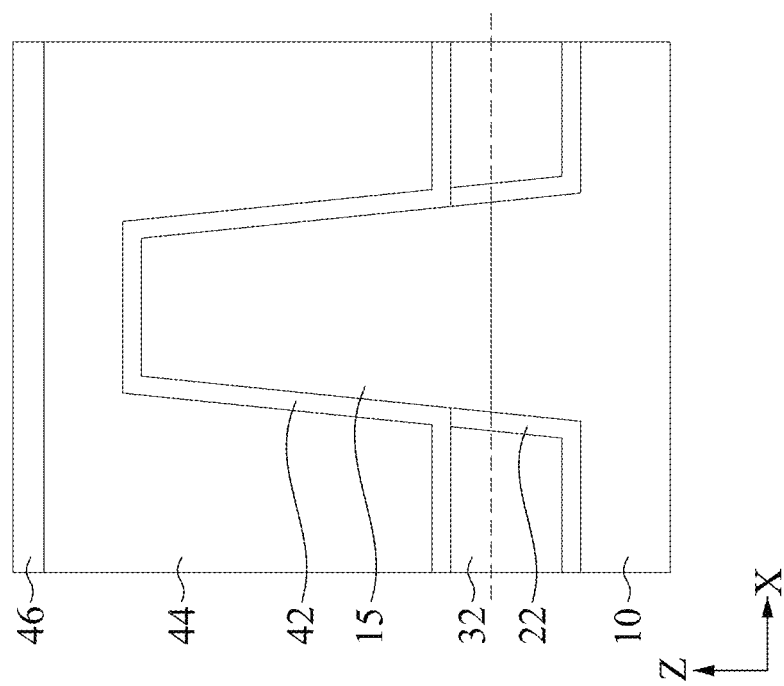

Then, as shown in FIGS. 10A and 10B, an epitaxial source/drain structure 50 is formed. FIG. 10A is a cross sectional view along the gate extending direction (X), and FIG. 10B is a cross sectional view along the source-to-drain direction (Y).

In some embodiments, the source/drain structure 50 includes one or more epitaxial semiconductor layers formed in a recess which is formed in the fin structure 20.

In some embodiments, the upper portion of the fin structure 20 is recessed by a dry etching and/or a wet etching operation. The upper portion of the fin structure 20 is recessed (etched) down to the level equal to or below the upper surface of the isolation insulating layer 32 in some embodiments.

The epitaxial source/drain structure 50 is made of one or more layers of semiconductor material having a different lattice constant than the fin structure 20 (channel regions). In some embodiments, SiGe having a higher Ge concentration than the SiGe channel layer 15 or Ge is formed. The epitaxial source/drain structure 50 is epitaxially formed over the upper portions of the recessed fin structures. Due to the crystal orientation of the substrate formed into the fin structures 20 (e.g., (100) plane), the epitaxial source/drain structure 50 grows laterally and has a diamond-like shape in some embodiments.

The source/drain epitaxial layer 50 may be grown at a temperature of about 600 to 800° C. under a pressure of about 80 to 150 Torr, by using a Si containing gas such as $SiH_4$, $Si_2H_6$ or $SiCl_2H_2$, and/or a Ge containing gas, such as $GeH_4$, $Ge_2H_6$ or $GeCl_2H_2$.

In some embodiments, after the epitaxial source/drain structure 50 is formed, a silicide layer is formed over the epitaxial source/drain structure 50. A metal material, such as Ni, Ti, Ta and/or W, is formed over the epitaxial source/drain structure 50, and an annealing operation is performed to form a silicide layer. In other embodiments, a silicide material, such as NiSi, TiSi, TaSi and/or WSi, is formed over the epitaxial source/drain structure 50, and an annealing operation may be performed. The annealing operation is performed at a temperature lower than the temperature of the melting laser annealing operation 80 to prevent further germanium redistribution, and the temperature is in a range from about 250° C. to about 850° C. The metal material or the silicide material is formed by CVD or ALD. The thickness of the silicide layer is in a range from about 4 nm to about 10 nm in some embodiments. Before or after the annealing operations, the metal material or the silicide material formed over the isolation insulating layer 32 is selectively removed. In some embodiments, the silicide layer is formed after the metal gate structure is formed.

Figure 11B:
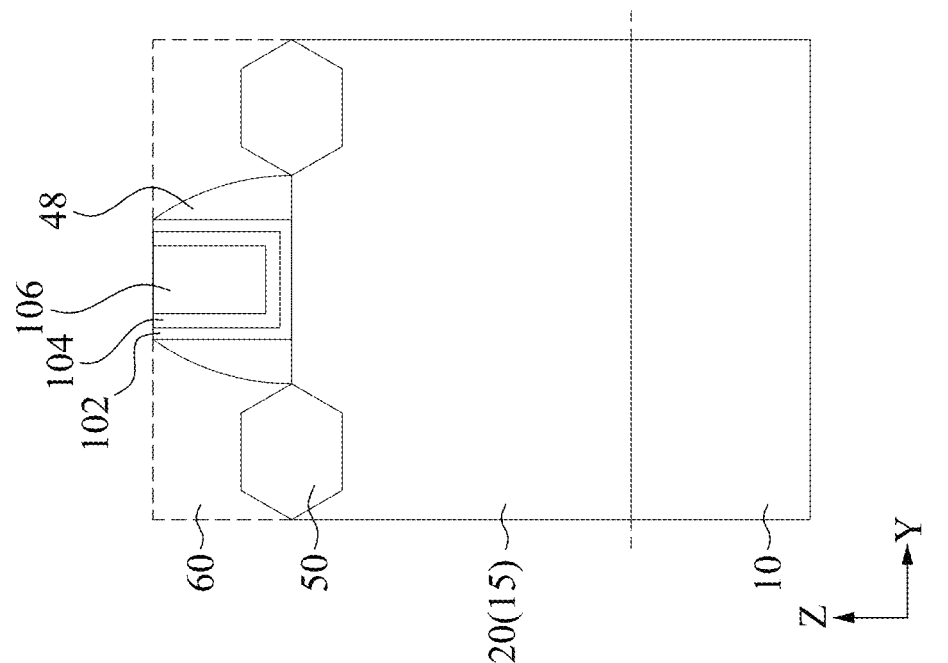
FIGS. 11A and 11B show cross sectional views of one of the various stages of a sequential semiconductor device manufacturing operation according to embodiments of the present disclosure.
Figure 11A:
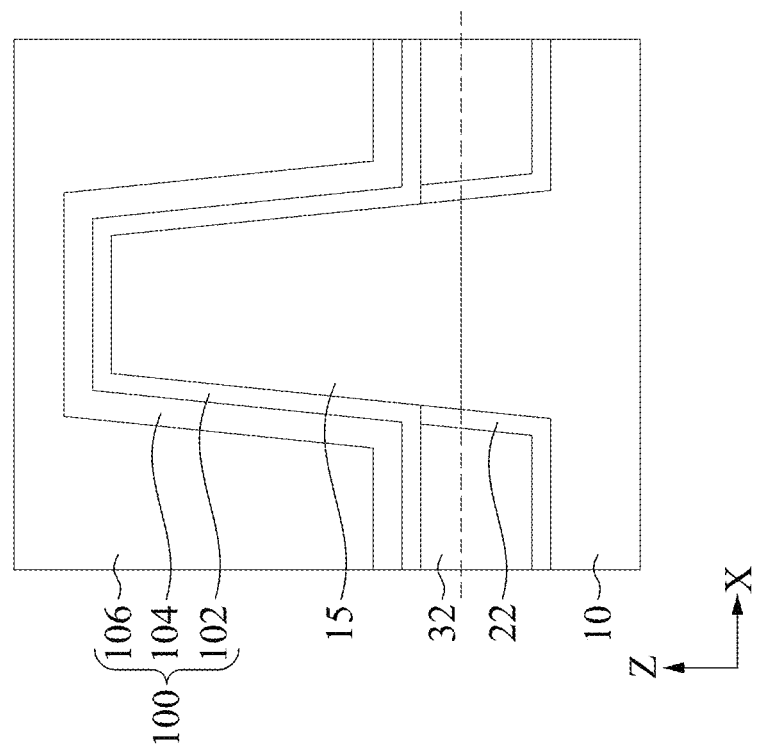

Then, a metal gate structure 100 is formed as shown in FIGS. 11A and 11B. FIG. 11A is a cross sectional view along the gate extending direction (X), and FIG. 11B is a cross sectional view along the source-to-drain direction (Y).

After the epitaxial source/drain structure 50 is formed, one or more interlayer dielectric (ILD) layers 60 are formed over the epitaxial source/drain structure 50. In some embodiments, before forming the ILD layer, an etch stop layer (ESL) is formed over the source/drain epitaxial layer 50 and sidewall spacers 48. The ESL is made of silicon nitride or a silicon nitride-based material (e.g., SiON, SiCN or SiOCN). The materials for the ILD layer 60 include compounds comprising Si, O, C and/or H, such as silicon oxide, SiCOH and SiOC. Organic materials, such as polymers, may be used for the ILD layer 60.

After the ILD layer 60 is formed, a planarization operation, such as an etch-back process and/or a chemical mechanical polishing (CMP) process, is performed to expose the upper surface of the sacrificial gate electrode layer 44. Then, the sacrificial gate electrode layer 44 is removed, thereby forming a gate space. When the sacrificial gate electrode layer 44 is polysilicon and the ILD layer 60 is silicon oxide, a wet etchant such as a tetramethylammonium hydroxide (TMAH) solution can be used to selectively remove the sacrificial gate electrode layer. Further, the sacrificial gate dielectric layer 42 is removed by appropriate etching processes.

The gate dielectric layer 102 is formed over the SiGe fin channel 15. In some embodiments, an interface layer (not shown) is formed over the SiGe channel 15. The interface layer may include silicon oxide, SiGe oxide or germanium oxide with a thickness of 0.2 nm to 1.5 nm in some embodiments. In other embodiments, the thickness of the interface layer is in a range about 0.5 nm to about 1.0 nm.

The gate dielectric layer 102 includes one or more layers of dielectric materials, such as silicon oxide, silicon nitride, or high-k dielectric material, other suitable dielectric material, and/or combinations thereof. Examples of high-k dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer is formed by, for example, chemical vapor deposition (CVD), physical vapor deposition (PVD), atomic layer deposition (ALD), high density plasma CVD (HDPCVD), or other suitable methods, and/or combinations thereof. The thickness of the gate dielectric layer 102 is in a range from about 1 nm to about 10 nm in some embodiments, and may be in a range from about 2 nm to about 7 nm in other embodiments.

The metal gate electrode is formed over the gate dielectric layer. The metal gate electrode includes one or more work function adjustment layers 104 and a body metal gate electrode layer 106. The work function adjustment layer 104 is made of a conductive material such as a single layer of TiN, TaN, TaAlC, TiC, TaC, Co, Al, TiAl, HfTi, TiSi, TaSi or TiAlC, or a multilayer of two or more of these materials. For the p-channel Fin FET, one or more of TiAlC, Al, TiAl, TaN, TaAlC, TiN, TiC and Co is used as the work function adjustment layer. The body metal gate electrode layer 106 includes any suitable metal material, such as aluminum, copper, titanium, tantalum, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. After depositing appropriate materials for the metal gate structures, planarization operations, such as CMP, are performed.

It is understood that the FinFET undergo further CMOS processes to form various features such as contacts/vias, interconnect metal layers, dielectric layers, passivation layers, etc.

Figure 12:
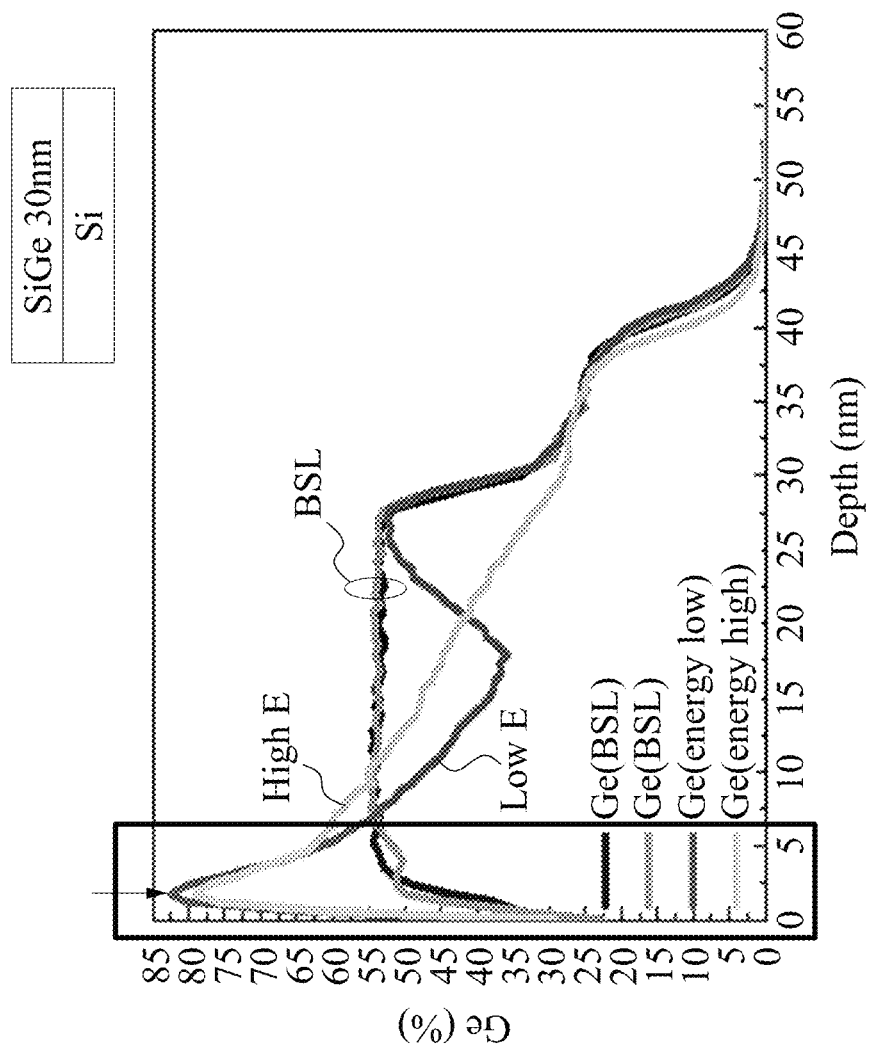
FIG. 12 shows elemental analysis results in a depth direction according to embodiments of the present disclosure.

FIG. 12 shows elemental analysis results using SIMS (secondary ion mass spectrometry) in a depth direction according to embodiments of the present disclosure. The analysis is performed on a sample having a blanket SiGe layer on a Si layer. The thickness of the SiGe layer is 30 nm and the Ge concentration is 55 atomic % ($Si_{0.45}Ge_{0.55}$). Two lines for BSL show Ge distributions before a melting laser annealing operation. Two lines for High E and Low E show Ge distributions after the melting laser annealing operation with two different energy conditions. The laser energy for High E is 1.72 $J/cm^2$ and the laser energy for Low E is 1.58 $J/cm^2$.

As shown in FIG. 12, before the melting laser annealing, germanium is almost evenly distributed in the SiGe layer. After the melting laser annealing operation, the Ge concentration is higher near the surface of the SiGe layer and has a peak at about 2-4 nm from the surface of the SiGe layer.

When the laser energy is high, the Ge concentration monotonously decreases from the peak to the center of the fin structure. When the laser energy is low, the Ge concentration decreases to a minimum and then increases again.

Figure 13:
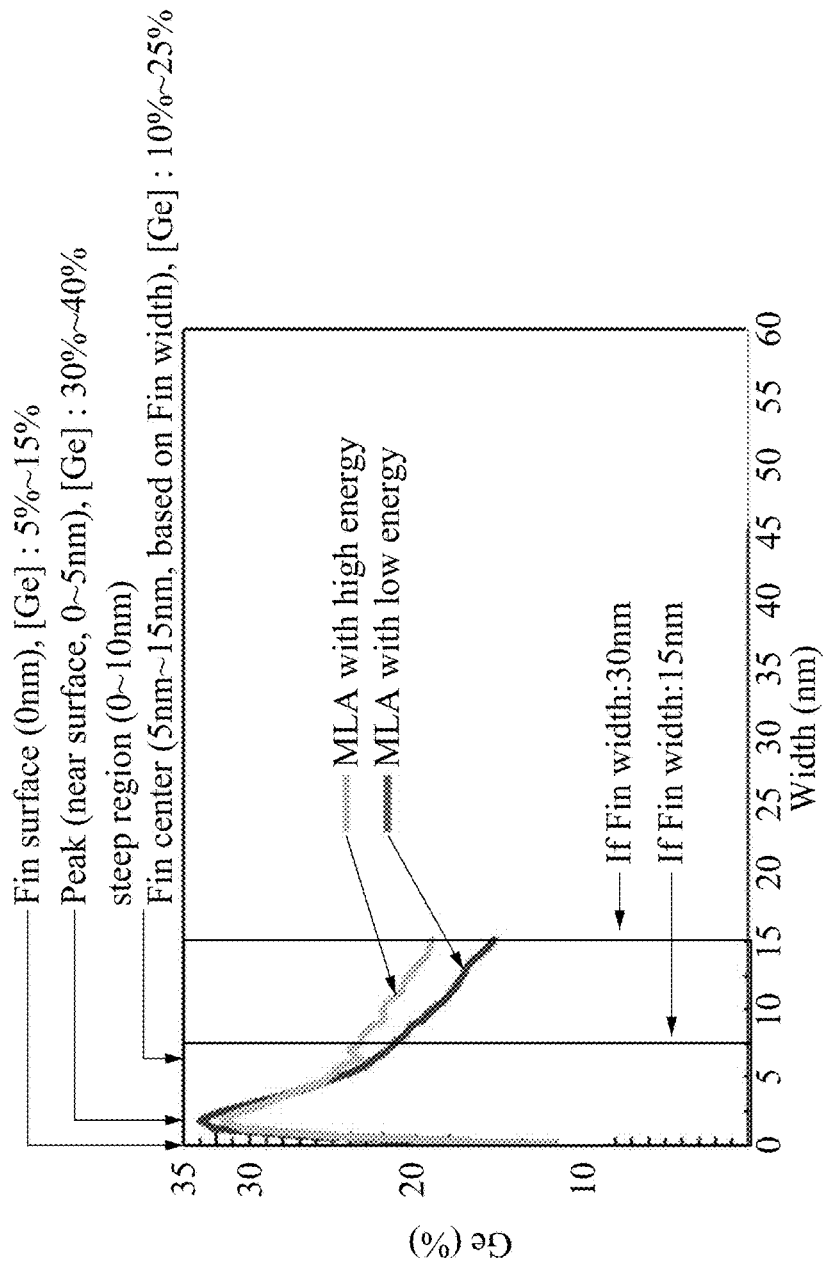
FIG. 13 shows simulated elemental analysis in a depth direction according to embodiments of the present disclosure.
Figure 13:
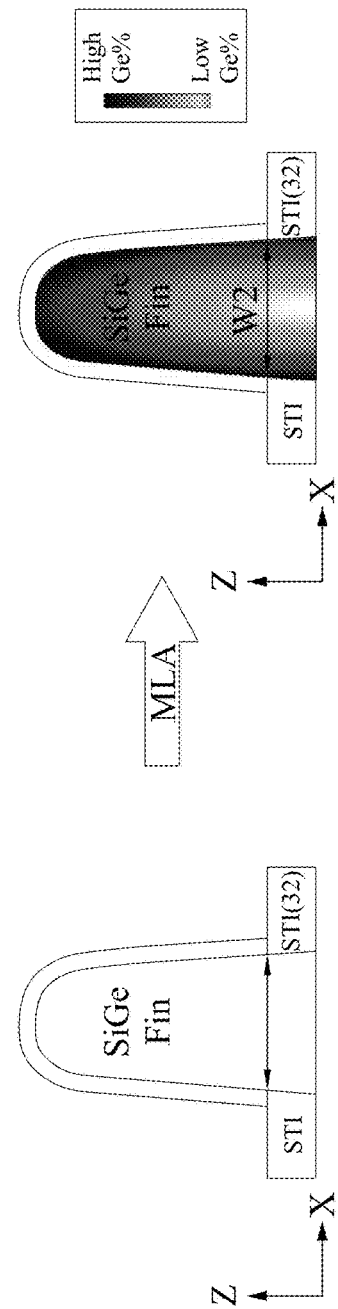

FIG. 13 shows a simulated elemental analysis in a depth direction after the Ge distribution. The Ge concentration before the redistribution is 20 atomic %. At the surface of the fin structure, the Ge concentration is about 5-15 atomic %, and the peak concentration is about 30-40% at a depth of about 1-5 nm from the surface.

When the fin width W2 (measured at the level of the isolation insulating layer (STI)) is 15 nm, the Ge concentration at the center of the fin structure (7.5 nm depth) is about 20-25 atomic %. When the fin width W2 is 30 nm, the Ge concentration at the center of the fin structure (15 nm depth) is about 15-20 atomic %. Comparing the high energy laser annealing and the low energy laser annealing, the low energy laser annealing results in a steeper slope toward the center of the fin structure from the peak than the case of the high energy laser annealing. In some embodiments, since germanium is redistributed by a thermal process, the Ge concentration gradually changes, and thus there is no concentration step in the SiGe fin structure or no multiple layers having different composition with an observable interface by, for example, transmission electron microscope (TEM). The Ge distribution shown in FIG. 13 is substantially symmetric along the X direction with respect to the center of the fin structure. Accordingly, there are two peaks in the Ge distribution when cutting the entire fin structure along the X direction.

In some embodiments, the difference between the highest Ge concentration and the lowest Ge concentration is in a range from about 5 to about 35 by points of percent.

Figure 14:
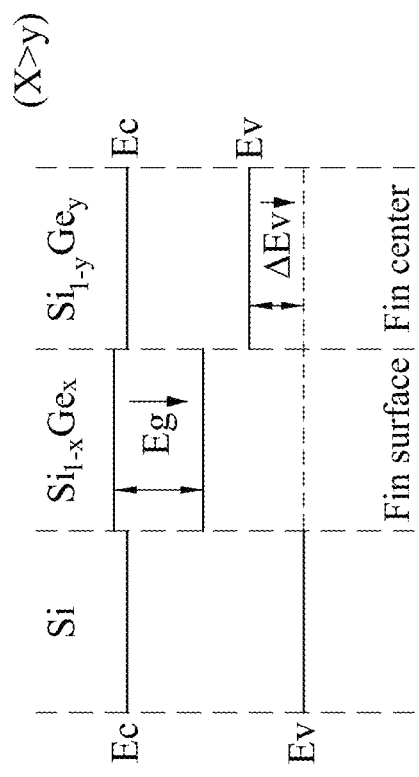
FIG. 14 shows a band diagram according to embodiments of the present disclosure.

FIG. 14 shows a theoretical explanation why a higher Ge concentration near the surface of the fin structure (channel region) improves on-current and current leakage. As shown in FIG. 14, the current ID depends on the energy band gap Eg and the carrier mobility of the semiconductor material constituting the channel region. The band diagram of FIG. 14 shows an energy band of the surface region ($Si_{1-x}Ge_x$) and an energy band of the center region ($Si_{1-y}Ge_y$), x>y, with reference to the Si band diagram. At the fin surface region, since the band gap Eg is smaller and the carrier mobility is higher, the on-current can be increased. At the center of the fin structure, the $\Delta Ev$ is smaller, and thus band-to-band tunneling current can be suppressed.

FIGS. 15-20 show exemplary cross sectional views of various stages for manufacturing a Fin FET device according to another embodiment of the present disclosure. It is understood that additional operations can be provided before, during, and after processes shown by FIGS. 15-20, and some of the operations described below can be replaced or eliminated, for additional embodiments of the method. The order of the operations/processes may be interchangeable.

Figure 15:
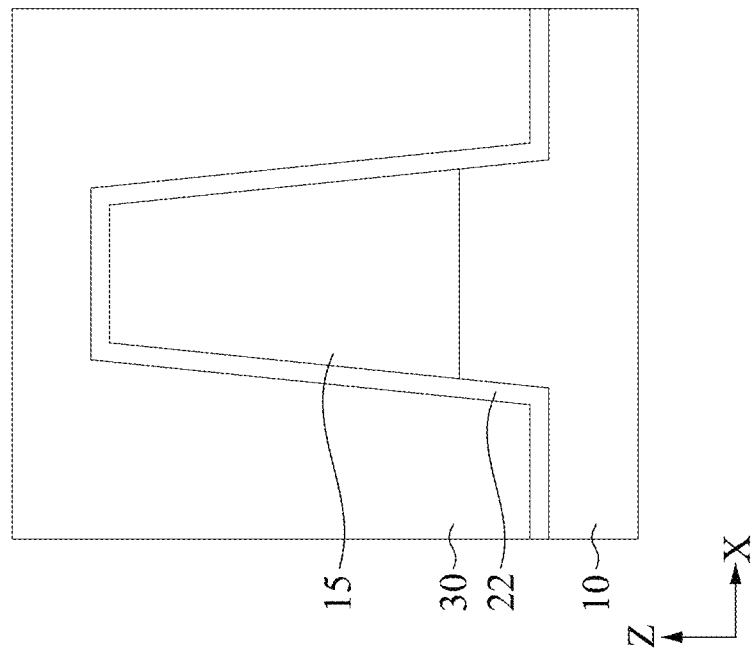
FIG. 15 shows a cross sectional view of one of the various stages of a sequential semiconductor device manufacturing operation according to embodiments of the present disclosure.

After the fin liner layer 22 is formed as shown in FIG. 4, an insulating material layer 30 is formed without performing a melting laser annealing, as shown in FIG. 15.

Figure 16:
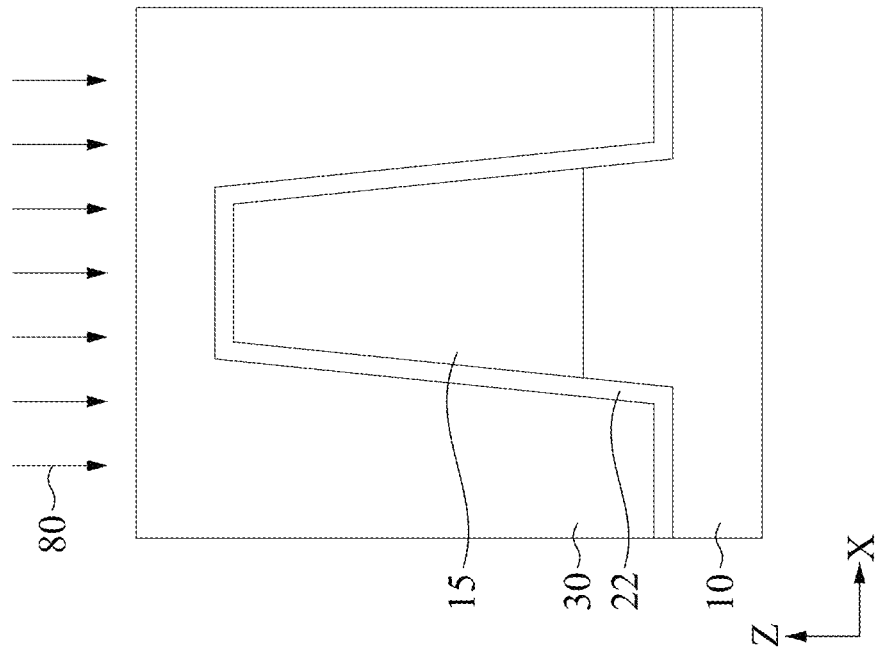
FIG. 16 shows a cross sectional view of one of the various stages of a sequential semiconductor device manufacturing operation according to embodiments of the present disclosure.
Figure 17:
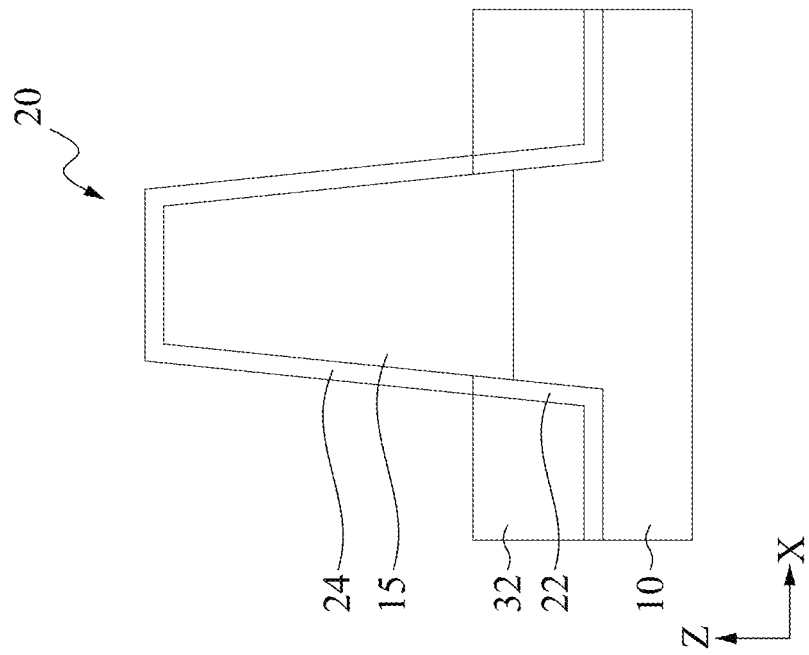
FIG. 17 shows a cross sectional view of one of the various stages of a sequential semiconductor device manufacturing operation according to embodiments of the present disclosure.

Similar to FIG. 7, an annealing operation 35 is performed as shown in FIG. 16. The annealing operation 35 includes an RTA using an infrared light in an inert gas ambient, such as an $N_2$, Ar or He ambient, in some embodiments. The temperature of the annealing operation 35 is in a range from about 600° C. to about 700° C. In some embodiments, the annealing time is in a range from about 1 sec to 60 sec. After the annealing operation 35, the insulating layer 30 and the fin liner layer 22 are recessed so as to expose the upper portion of the fin structure 20, to form an isolation insulating layer 32, as shown in FIG. 17.

Figure 18:
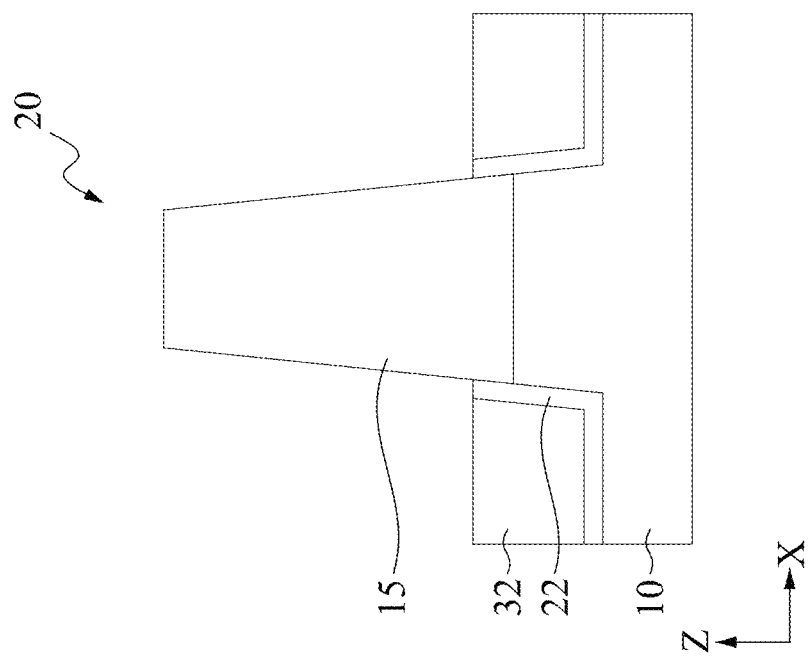
FIG. 18 shows a cross sectional view of one of the various stages of a sequential semiconductor device manufacturing operation according to embodiments of the present disclosure.

As shown in FIG. 18, a capping layer 24 is then formed on the exposed SiGe fin structure 20 to recover Dit defects. The capping layer is also formed on the upper surface of the isolation insulating layer 32. In some embodiments, the capping layer 24 includes an epitaxial semiconductor layer, such as crystalline Si or SiGe having a lower Ge concentration than the SiGe fin structure. The epitaxial semiconductor layer is selectively formed by an epitaxial growth. In some embodiments, since the capping layer 24 is selectively formed on the SiGe fin structure 20, no capping layer 24 is formed on the isolation insulating layer 32. In other embodiments, the capping layer is amorphous or polycrystalline Si. In some embodiments, the thickness of the capping layer 24 is in a range from about 5 nm to about 10 nm.

Figure 19:
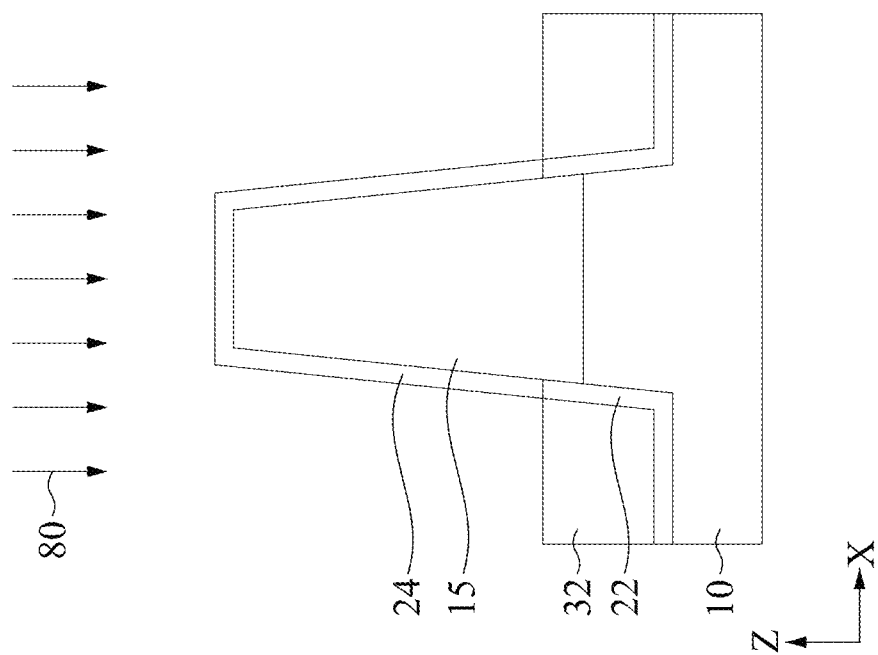
FIG. 19 shows a cross sectional view of one of the various stages of a sequential semiconductor device manufacturing operation according to embodiments of the present disclosure.

After the capping layer is formed, a melting laser annealing operation 80 is performed to redistribute germanium in the SiGe fin structure 20 through the capping layer, as shown in FIG. 19. In some embodiments, the energy of the laser is in a range from about 0.5 $J/cm^2$ to about 5 $J/cm^2$, and is in a range from about 1.0 $J/cm^2$ to about 2.0 $J/cm^2$ in other embodiments. In some embodiments, the laser irradiation time is in a range from 0.1 nsec to 10 nsec and in other embodiments, is in a range from about 0.5 nsec to about 5 nsec. In some embodiments, the SiGe fin structure 20 is heated to more than the melting point of SiGe. In some embodiments, the heated temperature is in a range from about 1200° C. to about 1400° C. In other embodiments, the temperature is in a range from about 800° C. to about 1200°

C. In some embodiments, the melting laser annealing operation 80 is performed in an inert gas ambient, such as an N₂, Ar or He ambient. The capping layer 24 can protect the SiGe fin structure 20 from undesirable oxidation.

Figure 20:
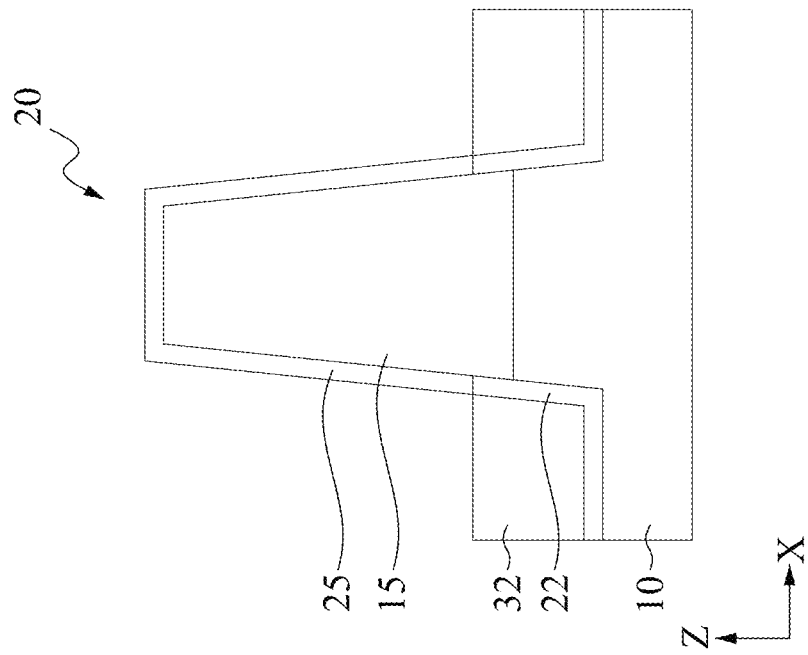
FIG. 20 shows a cross sectional view of one of the various stages of a sequential semiconductor device manufacturing operation according to embodiments of the present disclosure.

After the melting laser annealing operation, the capping layer 24 is removed in some embodiments. In other embodiments, the capping layer 24 remains and functions as a part of the channel. In certain embodiments, germanium moves into the capping layer 24, forming a surface SiGe layer 25 as shown in FIG. 20. In some embodiments, Ge concentration of the surface SiGe layer 25 is smaller than the peak Ge concentration. In other embodiments, the peak is located within the surface SiGe layer 25.

Thereafter, the operations explained with respect to FIGS. 9A-11B are performed.

FIGS. 21-24 show exemplary cross sectional views of various stages for manufacturing a Fin FET device according to another embodiment of the present disclosure. It is understood that additional operations can be provided before, during, and after processes shown by FIGS. 21-24, and some of the operations described below can be replaced or eliminated, for additional embodiments of the method. The order of the operations/processes may be interchangeable.

Figure 21:
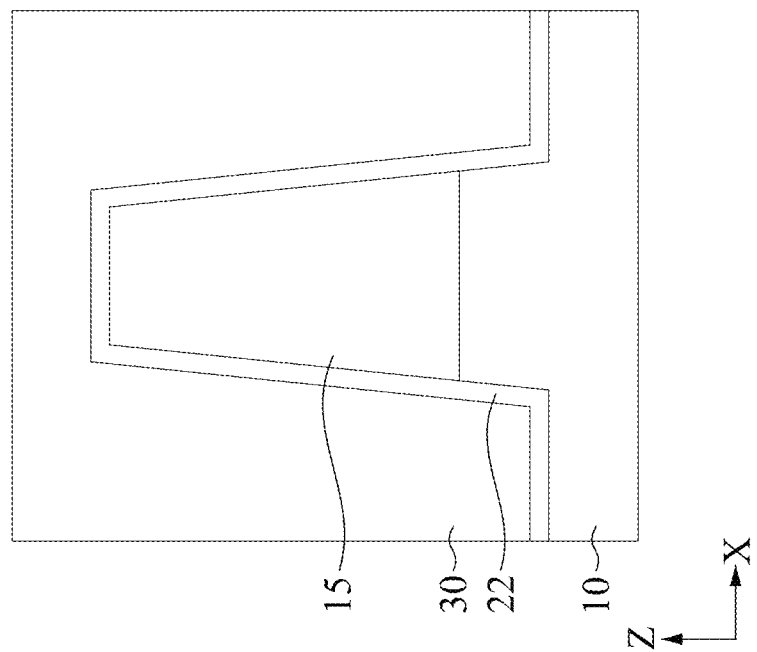
FIG. 21 shows a cross sectional view of one of the various stages of a sequential semiconductor device manufacturing operation according to embodiments of the present disclosure.

After the fin liner layer 22 is formed as shown in FIG. 4, an insulating material layer 30 is formed without performing a melting laser annealing, as shown in FIG. 21.

Figure 22:
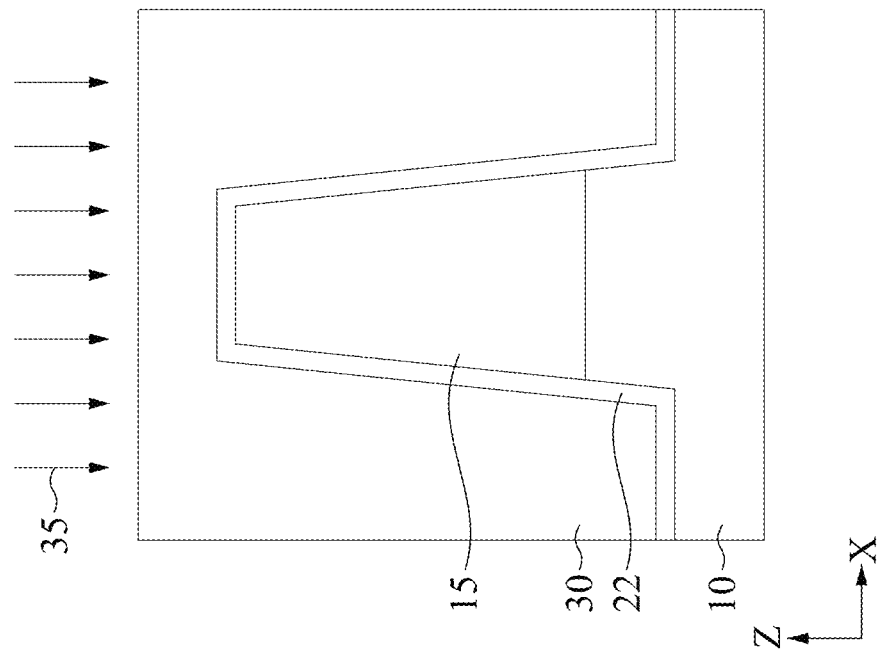
FIG. 22 shows a cross sectional view of one of the various stages of a sequential semiconductor device manufacturing operation according to embodiments of the present disclosure.

Similar to FIG. 7, an annealing operation 35 is performed as shown in FIG. 22. The annealing operation 35 includes an RTA using an infrared light in an inert gas ambient, such as an N₂, Ar or He ambient, in some embodiments. The temperature of the annealing operation 35 is in a range from about 600° C. to about 700° C. In some embodiments, the annealing time is in a range from about 1 sec to 60 sec.

Subsequently, a melting laser annealing operation 80 is performed to redistribute germanium in the SiGe fin structure 20 through the insulating layer 30 and the liner layer 22, as shown in FIG. 23. In some embodiments, the energy of the laser is in a range from about 0.5 J/cm² to about 5 J/cm², and is in a range from about 1.0 J/cm² to about 2.0 J/cm² in other embodiments. In some embodiments, the laser irradiation time is in a range from 0.1 nsec to 10 nsec and in other embodiments, is in a range from about 0.5 nsec to about 5 nsec. In some embodiments, the SiGe fin structure 20 is heated to more than the melting point of SiGe. In some embodiments, the heated temperature is in a range from about 1200° C. to about 1400° C. In other embodiments, the temperature is in a range from about 800° C. to about 1200° C. In some embodiments, the melting laser annealing operation 80 is performed in an inert gas ambient, such as an N₂, Ar or He ambient. When the liner layer 22 is made of silicon nitride, the liner layer 22 can protect the SiGe fin structure 20 from undesirable oxidation.

After the annealing operation 80, the insulating layer 30 and the fin liner layer 22 are recessed so as to expose the upper portion of the fin structure 20, to form an isolation insulating layer 32, as shown in FIG. 24. Thereafter, the operations explained with respect to FIGS. 9A-11B are performed.

In the present disclosure, the channel region of a FinFET is made of SiGe having uneven germanium distribution. In particular, the Ge concentration at or near the surface of the SiGe fin structure is higher than the Ge concentration in the center of the fin structure. With such a SiGe fin structure, it is possible to enhance on-state current by higher carrier mobility and lower threshold voltage Vt due to the higher Ge concentration at the surface region of the fin structure, while suppressing current leakage at the sub threshold region due to the lower Ge concentration at the center region of the fin structure.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device including a Fin FET, a fin structure, which has an upper fin structure made of SiGe and a bottom fin structure made of a different material than the upper fin structure, is formed, a cover layer is formed over the fin structure, a thermal operation is performed on the fin structure covered by the cover layer, and a source/drain epitaxial layer is formed in a source/drain region of the upper fin structure. The thermal operation changes a germanium distribution in the upper fin structure. In one or more of the foregoing and the following embodiments, the thermal operation is performed before the source/drain epitaxial layer is formed. In one or more of the foregoing and the following embodiments, the thermal operation is a melting laser annealing. In one or more of the foregoing and the following embodiments, the melting laser annealing causes melting of the upper fin structure, and then the upper fin structure is recrystallized having a different germanium distribution than before performing the melting laser annealing. In one or more of the foregoing and the following embodiments, a Ge concentration of the upper fin structure before the thermal operation is in a range from 15 atomic % to 30 atomic %. In one or more of the foregoing and the following embodiments, after the thermal operation, a Ge concentration at or near a surface of the upper fin structure is higher than a Ge concentration at a center of the upper fin structure. In one or more of the foregoing and the following embodiments, the Ge concentration has a peak at a depth from the surface of the upper fin structure in a range from 1 nm to 5 nm. In one or more of the foregoing and the following embodiments, a difference between a highest Ge concentration and a lowest Ge concentration in the upper fin structure is in a range from 5 to 35 by points of percent. In one or more of the foregoing and the following embodiments, the cover layer is made of silicon nitride. In one or more of the foregoing and the following embodiments, the cover layer is an epitaxial semiconductor layer. In one or more of the foregoing and the following embodiments, the cover layer includes two or more insulating material layers. In one or more of the foregoing and the following embodiments, after the thermal operation, the cover layer is at least partially removed.

In accordance with another aspect of the present disclosure, in a method of manufacturing a semiconductor device including a Fin FET, a fin structure, which has an upper fin structure made of SiGe and a bottom fin structure made of a different material than the upper fin structure, is formed, a liner layer is formed over the fin structure, an insulating material layer is formed over the liner layer, the insulating material layer and the liner layer are recessed to expose an upper part of the upper fin structure, a capping layer is formed over the exposed upper part of the upper fin structure, a thermal operation is performed on the fin structure with the capping layer, and a source/drain epitaxial layer is formed in a source/drain region of the upper fin structure. The thermal operation changes a germanium distribution in the upper fin structure. In one or more of the foregoing and the following embodiments, a Ge concentration of the upper fin structure before the thermal operation is in a range from 15 atomic % to 30 atomic %. In one or more of the foregoing and the following embodiments, the capping layer is an epitaxially formed Si layer or an epitaxially formed SiGe having a lower Ge concentration than the upper fin structure before the thermal operation. In one or more of the foregoing and the following embodiments, a thickness of the capping layer is in a range from 5 nm to 10 nm. In one or more of the foregoing and the following embodiments, the thermal operation is a melting laser annealing. In one or more of the foregoing and the following embodiments, an energy of the melting laser annealing is in a range from 1.0 J/cm$^2$ to 2.0 J/cm$^2$. In one or more of the foregoing and the following embodiments, a time duration of the melting laser annealing is in a range from 0.5 nsec to 5 nsec.

In accordance with another aspect of the present disclosure, in a method of manufacturing a semiconductor device including a Fin FET, a fin structure, which has an upper fin structure made of SiGe and a bottom fin structure made of a different material than the upper fin structure, is formed, a liner layer is formed over the fin structure, an insulating material layer is formed over the liner layer, a thermal operation is performed on the fin structure through the insulating material layer and the liner layer, and a source/drain epitaxial layer is formed in a source/drain region of the upper fin structure. The thermal operation changes a germanium distribution in the upper fin structure.

In accordance with one aspect of the present disclosure, a semiconductor device includes a fin structure having a channel region and a source/drain region, a gate structure including a gate dielectric layer over the channel region and a gate electrode over the gate dielectric layer, and a source/drain epitaxial layer formed in the source/drain region. The channel region includes SiGe having a non-uniform Ge concentration such that a Ge concentration at or near a surface of the fin structure is higher than a Ge concentration at a center of the fin structure. In one or more of the foregoing and the following embodiments, the Ge concentration gradually changes in the channel region. In one or more of the foregoing and the following embodiments, a Ge concentration at or near a surface of the channel region in contact with the gate dielectric layer is higher than a Ge concentration at a center of the channel region. In one or more of the foregoing and the following embodiments, the Ge concentration has a peak at a depth from the surface of the channel region in a range from 1 nm to 5 nm. In one or more of the foregoing and the following embodiments, a Ge concentration at the peak is in a range from 30 atomic % to 40 atomic %. In one or more of the foregoing and the following embodiments, a lowest Ge concentration in the channel region is in a range from 10 atomic % to 25 atomic %. In one or more of the foregoing and the following embodiments, a difference between a highest Ge concentration and a lowest Ge concentration in the channel region is in a range from 5 to 35 by points of percent. In one or more of the foregoing and the following embodiments, the semiconductor device further includes an isolation insulating layer from which the fin structure protrudes. In one or more of the foregoing and the following embodiments, the fin structure includes a fin bottom structure and a upper fin portion including the channel region, and the fin bottom structure is made of a different semiconductor material than the upper fin portion. In one or more of the foregoing and the following embodiments, the semiconductor device further includes a liner layer disposed on side faces of the fin bottom structure. In one or more of the foregoing and the following embodiments, the liner layer covers a bottom portion of the upper fin portion. In one or more of the foregoing and the following embodiments, a width of the channel along a gate extending direction at a level of an upper surface of the isolation insulating layer is in a range from 15 nm to 30 nm. In one or more of the foregoing and the following embodiments, the Ge concentration has two peaks. In one or more of the foregoing and the following embodiments, the Ge concentration at the surface of the channel region is in a range from 5 atomic % to 15 atomic %.

In accordance with another aspect of the present disclosure, a semiconductor device includes, a fin structure having a channel region and a source/drain region, a gate structure including a gate dielectric layer over the channel region and a gate electrode over the gate dielectric layer, and a source/drain epitaxial layer formed in the source/drain region. The channel region includes SiGe layer having a non-uniform Ge concentration and a cap semiconductor layer over the SiGe layer. In one or more of the foregoing and the following embodiments, a Ge concentration in the SiGe layer at or near an interface between the SiGe layer and the cap semiconductor layer is higher than a Ge concentration at a center of the channel region. In one or more of the foregoing and the following embodiments, the Ge concentration has a peak at a depth from the interface of the channel region in a range from 1 nm to 5 nm. In one or more of the foregoing and the following embodiments, the Ge concentration at the peak is in a range from 30 atomic % to 40 atomic %. In one or more of the foregoing and the following embodiments, the Ge concentration at the peak is higher than a Ge concentration in the cap semiconductor layer.

In accordance with another aspect of the present disclosure, a semiconductor device includes a fin structure having a fin bottom structure and a upper fin portion including a channel region and a source/drain region, an isolation insulating layer from which the channel region protrudes, a gate structure including a gate dielectric layer over the channel region and a gate electrode over the gate dielectric layer, and a source/drain epitaxial layer formed in the source/drain region. A Ge concentration at or near a surface of the channel region in contact with the gate dielectric layer is higher than a Ge concentration at a center of the channel region.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a fin structure having a channel region and a source/drain region;
   a gate structure including a gate dielectric layer over the channel region and a gate electrode over the gate dielectric layer; and
   a source/drain epitaxial layer formed in the source/drain region, wherein the channel region includes SiGe having a non-uniform Ge concentration that has a peak at a depth from a surface of the channel region and gradually and continuously decreases from the depth toward a center of the channel region, and wherein the Ge concentration at the surface of the channel region is in a range from 5 atomic % to 15 atomic %.

2. The semiconductor device of claim 1, wherein the depth from the surface of the channel region is in a range from 1 nm to 5 nm.

3. The semiconductor device of claim 2, wherein the Ge concentration at the peak is in a range from 30 atomic % to 40 atomic %.

4. The semiconductor device of claim 2, wherein a lowest Ge concentration in the channel region is in a range from 10 atomic % to 25 atomic %.

5. The semiconductor device of claim 2, wherein a difference between a highest Ge concentration and a lowest Ge concentration in the channel region is in a range from 5 to 35 by points of percent.

6. The semiconductor device of claim 1, further comprising an isolation insulating layer from which the fin structure protrudes.

7. The semiconductor device of claim 6, wherein:
the fin structure includes a fin bottom structure and an upper fin portion including the channel region, and
the fin bottom structure is made of a different semiconductor material than the upper fin portion.

8. The semiconductor device of claim 7, comprising a liner layer disposed on side faces of the fin bottom structure.

9. The semiconductor device of claim 8, wherein the liner layer covers a bottom portion of the upper fin portion.

10. The semiconductor device of claim 6, wherein a width of the channel along a gate extending direction at a level of an upper surface of the isolation insulating layer is in a range from 15 nm to 30 nm.

11. The semiconductor device of claim 1, wherein the Ge concentration has two peaks.

12. The semiconductor device of claim 8, wherein the liner layer includes one or more layers of silicon oxide, silicon nitride, SiON, SiCN and SiOCN.

13. A semiconductor device, comprising:
a fin structure having a channel region and a source/drain region;
a gate structure including a gate dielectric layer over the channel region and a gate electrode over the gate dielectric layer; and
a source/drain epitaxial layer formed in the source/drain region,
wherein the channel region includes a SiGe layer having a non-uniform Ge concentration that has a peak at a depth from a surface of the channel region and gradually and continuously decreases from the depth toward a center of the channel region and a cap semiconductor layer over the SiGe layer, and wherein the Ge concentration at the surface of the channel region is in a range from 5 atomic % to 15 atomic %.

14. The semiconductor device of claim 13, wherein the depth from the surface of the channel region is in a range from 1 nm to 5 nm.

15. The semiconductor device of claim 13, wherein the Ge concentration at the peak is in a range from 30 atomic % to 40 atomic %.

16. The semiconductor device of claim 13, wherein the Ge concentration at the peak is higher than a Ge concentration in the cap semiconductor layer.

17. The semiconductor device of claim 13, wherein a difference between a highest Ge concentration and a lowest Ge concentration in the channel region is in a range from 5 to 35 by points of percent.

18. A semiconductor device, comprising:
a fin structure having a fin bottom structure and an upper fin portion including a channel region and a source/drain region;
an isolation insulating layer from which the channel region protrudes;
a gate structure including a gate dielectric layer over the channel region and a gate electrode over the gate dielectric layer; and
a source/drain epitaxial layer formed in the source/drain region,
wherein the channel region includes a SiGe layer having a non-uniform Ge concentration that has a peak at a depth from a surface of the channel region and gradually and continuously decreases from the depth toward a center of the channel region, and wherein the Ge concentration at the surface of the channel region is in a range from 5 atomic % to 15 atomic %.

19. The semiconductor device of claim 18, the depth from the surface of the channel region is in a range from 1 nm to 5 nm.

20. The semiconductor device of claim 18, wherein the Ge concentration at the peak is in a range from 30 atomic % to 40 atomic %.

21. The semiconductor device of claim 18, wherein a lowest Ge concentration in the channel region is in a range from 10 atomic % to 25 atomic %.

* * * * *